(12) United States Patent
Lee et al.

(10) Patent No.: US 7,790,622 B2
(45) Date of Patent: Sep. 7, 2010

(54) METHODS FOR REMOVING GATE SIDEWALL SPACERS IN CMOS SEMICONDUCTOR FABRICATION PROCESSES

(75) Inventors: Kyoung Woo Lee, Suwon-si (KR); Ja Hum Ku, Gyeonggi-do (KR); Jun Jung Kim, Gyeonggi-do (KR); Chong Kwang Chang, Gyeonggi-do (KR); Min-Chul Sun, Gyeonggi-do (KR); Jong Ho Yang, Fishkill, NY (US); Thomas W. Dyer, Pleasant Valley, NY (US)

(73) Assignees: Samsung Electronics Co., Ltd., Suwon-Si (KR); International Business Machines Corporation, Armonk, NY (US)

( * ) Notice: Subject to any disclaimer, the term of this patent is extended or adjusted under 35 U.S.C. 154(b) by 591 days.

(21) Appl. No.: 11/778,038

(22) Filed: Jul. 14, 2007

(65) Prior Publication Data
US 2009/0017625 A1 Jan. 15, 2009

(51) Int. Cl.
*H01L 21/311* (2006.01)
(52) U.S. Cl. .............. 438/745; 438/694; 257/E21.257; 216/67
(58) Field of Classification Search .................. 216/13, 216/41, 83; 438/694, 745; 257/E21.257
See application file for complete search history.

(56) References Cited

U.S. PATENT DOCUMENTS

2005/0164440 A1* 7/2005 Yaung et al. ................. 438/197

FOREIGN PATENT DOCUMENTS

| JP | 10200097 | 7/1998 |
|---|---|---|
| JP | 10200097 T | 7/1998 |
| JP | 2002-43567 | 2/2002 |
| JP | 2002-270824 | 9/2002 |
| JP | 2002-270824 T | 9/2002 |
| JP | 2003-332575 | 11/2003 |
| JP | 2005-12075 | 1/2005 |
| JP | 2005-12075 T | 1/2005 |
| KR | 10-343135 | 9/2002 |
| KR | 10-0393216 | 7/2003 |
| KR | 10-0398874 | 9/2003 |

* cited by examiner

*Primary Examiner*—Shamim Ahmed
*Assistant Examiner*—Stephanie Duclair
(74) *Attorney, Agent, or Firm*—F. Chau & Associates, LLC

(57) ABSTRACT

Semiconductor fabrication processes are provided for removing sidewall spacers from gate structures while mitigating or otherwise preventing defect mechanisms such as damage to metal silicide structures or otherwise impeding or placing limitations on subsequent process flows.

36 Claims, 8 Drawing Sheets

US 7,790,622 B2

METHODS FOR REMOVING GATE SIDEWALL SPACERS IN CMOS SEMICONDUCTOR FABRICATION PROCESSES

TECHNICAL FIELD OF THE INVENTION

The present invention relates generally to methods for fabricating CMOS (complementary Meal-Oxide Semiconductor) devices and, in particular, CMOS fabrication techniques which incorporate methods for removing sidewall spacers from gate structures while mitigating or otherwise preventing damage to metal silicide structures.

BACKGROUND

In general, CMOS semi-conductor devices include integrated circuits having complementary pairs of P-channel field-effect transistors and M-channel field-effect transistors formed on a common semiconductor substrate. As is generally known in the art, CMOS technologies are typically used to fabricate IC (integrated circuit) chips for high density and high-performance applications due to, e.g., the high operation efficiency, high switching speed, and good scaling properties that are characteristic of CMOS devices. Technological innovations in semiconductor fabrication technologies are driving market demands for CMOS solutions for higher speed, higher integration density, and lower power applications. The downscaling of CMOS technologies to submicron design rules and beyond, however, poses technological challenges with respect to maintaining performance and reliability. For example, as device sizes are downscaled, CMOS transistors must be formed with, e.g., thinner gate electrodes, smaller channel lengths, and shallower drain/source extension diffusion regions. This downscaling generally results in transistors having higher channel resistance and higher junction/contact parasitic resistances, leading to degraded performance. To mitigate the impact on device performance with downscaling, various state of the art CMOS fabrication techniques can be implemented to effectively reduce parasitic gate and junction resistances and increase channel conductivity.

For example, DSL (dual stress liner) techniques can be incorporated in CMOS process flows as a means to enhance performance of highly-scaled CMOS devices. In general, DSL technologies are premised on findings that the application of a sufficient compressive stress to the conduction channel of a P-type transistor can improve the carrier (holes) mobility within the channel, while the application of a sufficient tensile stress to the conduction channel of an N-type transistor can improve the carrier (electrons) mobility within the channel. In this regard, various DSL techniques that have been developed to improve device performance by forming a compressive stress insulating liner over the gate structure of P-type transistors while forming tensile stress insulating liners over the gate structures of N-type transistor devices, for the purposes of increasing the charge carrier mobility in the transistor channels.

Other state of the art CMOS fabrication processes for increasing transistor performance in highly-scaled applications include ion implantation techniques that are designed to form complex dopant profiles/structures for drain/source regions, which effectively reduce the sheet and contact resistances of the transistor channel/junction/contact regions. Moreover, CMOS fabrication processes can implement state of the art Salicide (self-aligned silicide) technologies for silicidation of polysilicon gate structures and source and drain diffusion regions to thereby reduce gate and junction resistances.

In general, ion implantation and salicide techniques are typically implemented in conjunction with spacer fabrication techniques to form insulating spacers on the sidewalls of gate electrodes that serve as masks for ion implantation and salicidation. By way of specific example, nitride spacers are typically formed on the sidewalls of a gate electrode to serve as masks to control ion implantation profiles of source/drain regions offset from the edges of the gate electrode. Moreover, nitride spacers serve as masks to form metal silicide layers on polysilicon gate electrodes and drain/source diffusion regions in a self-aligned fashion. Although gate sidewall spacer elements facilitate ion implantation and salicidation, these spacers are typically designed to optimize ion implantation and salicidation processes, but not other processes. In this regard, the use of spacer elements and/or the process of forming such spacers, can adversely affect other process steps, resulting in degraded performance or reliability, or other pose practical limitations on integration density.

For example, as CMOS devices scale down and the critical dimensions of the gate electrodes decrease (smaller gate length and spacing between gate stacks), the gate sidewall spacers pose a limitation to integration density. Indeed, for a given design rule, the sidewall spacers effectively increase the width of the gate stack structure and narrow the spacing (gaps) between adjacent transistor devices. In other words, for a given design rule, the gate sidewall spacers increase the aspect ratio of the gaps between the gate structures, and such increased aspect ratio can render subsequent deposition based processing steps more difficult. For example, the spacers may adversely affect gap filling ability of a subsequent inter-layer dielectric (ILD) layer deposition.

In addition, the use of gate sidewall spacers can be problematic in DSL applications. For example, in high-density applications where the thickness of the spacers further narrows the spacing between adjacent transistor devices, there may be limitations on the allowable thickness of the dielectric stress liner layers that can be achieved to obtain a desired stress characteristic. Moreover, in DSL and non-DSL applications, the gate sidewall spacers may impart unwanted stresses in the transistor channel regions, which can counteract the desired stresses provided by the stress liner layers (for DSL applications), thereby adversely affecting performance. Therefore, for certain applications, it is desirable to remove the gate side wall spacers.

SUMMARY OF THE INVENTION

The present invention relates generally to CMOS (complementary Meal-Oxide Semiconductor) fabrication processes and, in particular, CMOS fabrication techniques which incorporate methods for removing sidewall spacers from gate structures while mitigating or otherwise preventing defect mechanisms such as damage to metal silicide structures or otherwise impeding or placing limitations on subsequent process flows.

In one exemplary embodiment of the invention, a method for fabricating a semiconductor device includes forming a transistor device in an active silicon region of a semiconductor substrate, wherein the transistor device comprises a gate structure having a gate electrode and first and second sidewall spacers formed on respective first and second sidewalls of the gate electrode, and first and second diffusion regions formed in the active silicon region adjacent the first and second sidewall spacers, respectively, wherein the first and second sidewall spacers each comprise a first spacer insulating layer and a second spacer insulating layer, wherein the first spacer insulating layer is interposed between the second spacer insulating layer and the gate electrode sidewall and a surface of the active silicon region adjacent the first and second sidewalls of the gate electrode.

A spacer removal process according to one exemplary embodiment of the invention is performed to remove the second sidewall spacers by forming a conformal insulating layer over the gate structure and the active silicon region, forming an etch mask of organic material to cover a portion of the conformal insulating layer formed over the active silicon region while exposing a portion of the conformal insulating layer formed on upper sidewall and top surfaces of the gate structure and etching the exposed portion of the conformal insulating layer using the etch mast of organic material. The second spacer insulating layers of the first and second sidewall spacers are then removed using an etch process in which an etch selectivity of material forming the second spacer insulating layer is greater than that an etch selectivity of the materials forming the first spacer insulating layers and the conformal insulating layer so as to protect the sidewall surfaces of the gate electrode and the surface of the active silicon region from etch damage when etching the second spacer insulating layers.

A spacer removal process according to another exemplary embodiment of the invention may be performed to remove the second sidewall spacers, which includes forming a first conformal insulating layer to cover the gate structure and the first and second silicide layers in the active silicon region adjacent the first and second sidewall spacers, forming a second conformal insulating layer over the first conformal insulating layer, and depositing a layer of organic material over the second conformal insulating layer. A first etch process is performed to etch back the layer of organic material to expose a portion of the second conformal insulating layer formed on upper sidewall and top surfaces of the gate structure and form an etch mask to cover a portion of the second and first conformal insulating layer formed over the first and second silicide layers in the active silicon region. A second etch process is performed to remove the exposed portion of the second conformal insulating layer down to the first conformal insulating layer using the etch mask of organic material, followed by removing the etch mast of organic material to expose the portion of the second conformal layer formed over the first and second silicide layers and active silicon region. A third etch process is performed to remove exposed portions of the first conformal insulating layer down to the second spacer insulating layers using an etch process in which an etch selectivity of a material forming the first conformal insulating layer is greater than an etch selectivity of materials forming the second spacer insulating layers and the second conformal insulating layer such that second conformal insulating layer protects the first and second silicide and the active silicon region from etch damage during the third etch process. A fourth etch process is performed to remove the second spacer insulating layers using an etch process in which an etch selectivity of the material forming the second spacer insulating layers is greater than an etch selectivity of materials forming the first spacer insulating layers and the first conformal insulating layer such that first spacer insulating layers and the first conformal insulating layer protects sidewalls of the gate electrode, the first and second silicide layers and the active silicon region from etch damage during the fourth etch process These and other exemplary embodiments, aspects, objects, features and advantages of the present invention will become apparent from the following detailed description of exemplary embodiments, which is to be read in connection with the accompanying drawings.

DETAILED DESCRIPTION OF EXEMPLARY EMBODIMENTS

Figure 1A:
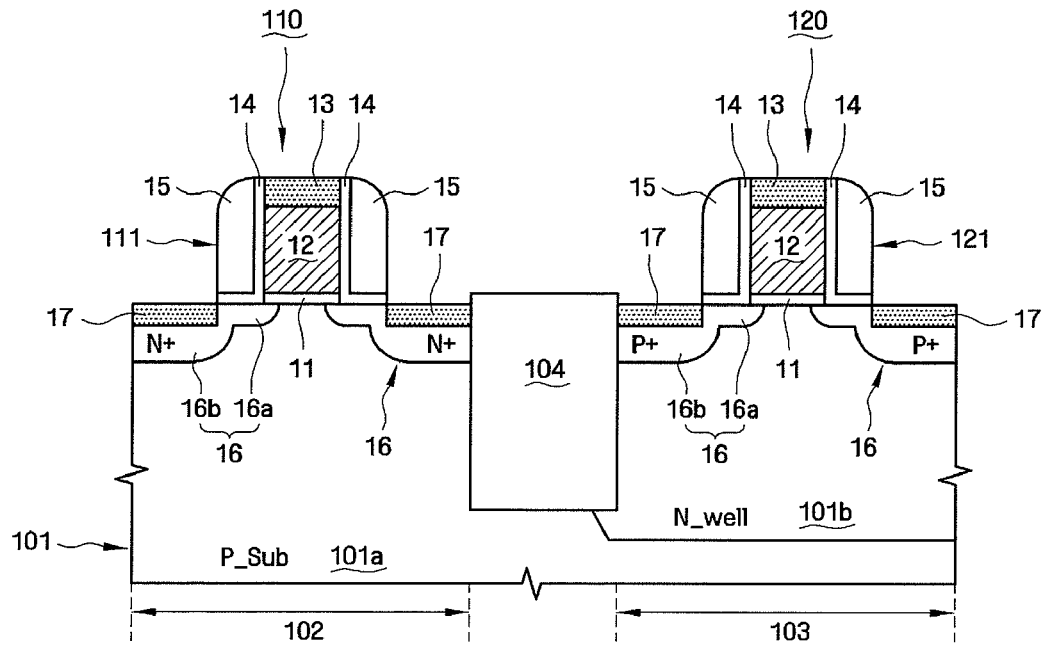
FIGS. 1A~1J schematically illustrate a CMOS semiconductor fabrication process which incorporates a spacer removal process according to an exemplary embodiment of the invention.

Exemplary embodiments of the invention will now be described more fully with reference to the schematic illustrations in the accompanying drawings in which it is to be understood that the thickness and dimensions of the layers and regions are exaggerated for clarity. It is to be further understood that when a layer is described as being "on" or "over" another layer or substrate, such layer may be directly on the other layer or substrate, or intervening layers may also be present. Moreover, similar reference numerals that are used throughout the drawings are used to denote elements that are the same or similar or having the same or similar functions.

FIGS. 1A~1J schematically illustrate a CMOS semiconductor fabrication process which incorporates a spacer removal process according to an exemplary embodiment of the invention. More specifically, FIGS. 1A~1J are schematic cross-sectional views of a CMOS semiconductor device (100) at various stages of an exemplary FEOL (front-end-of-line) CMOS fabrication process, where FIG. 1A is a cross-sectional schematic view of the CMOS semiconductor device (100) at an intermediate stage of fabrication where complementary transistor structures (110) and (120) are formed on a semiconductor substrate (101). FIG. 1A illustrates a general framework of CMOS device that is formed using a CMOS fabrication process that incorporates gate spacers techniques for defining source/drain doping profiles and serving as masks for forming metal silicide regions.

Moreover, FIGS. 1B~1H are cross-sectional schematic views of the semiconductor device (100) at subsequent stages of the exemplary CMOS fabrication process following formation of the structure shown in FIG. 1A, which illustrate an exemplary method for removing gate sidewall spacers from gate structures of the complementary CMOS transistors (110) and (120) while avoiding damage to silicide regions formed on drain-source regions and poly gates. In addition, FIGS. 1I and 1J schematically illustrate initial stages of a DSL (dual stress liner) process flow, which may be implemented as part of the exemplary CMOS fabrication process subsequent to the spacer removal process flow of FIGS. 1B~1H. As explained below, FIGS. 1I and 1J illustrate a manner in which the exemplary spacer removal process of FIGS. 1B~1H allows for silicide regions to be protected from damage during formation of dual stress liners according to an exemplary embodiment of the invention.

The exemplary process of FIGS. 1A~1J will now be discussed in further detail with initial reference to FIG. 1A, which illustrates a CMOS semiconductor device (100) having NMOS and PMOS transistor structures (110) and (120) formed in respective active regions (102) and (103) on an active surface of a semiconductor substrate (101). The active regions (102) and (103) are defined and separated by an isolation structure (104) (e.g., STI (shallow trench isolation) structure). In the illustrative embodiment, the active region (102) is defined by a portion of a P-type substrate layer (101a) and the active region (103) comprises an N-type device well (101b) formed in the P-type substrate layer (101a). The NMOS transistor (110) comprises a gate structure (111) formed on the substrate surface in the active region (102), as well as n-doped drain/source diffusion regions (16) formed in the p-type substrate layer (101a). Similarly, the PMOS transistor (120) comprises a gate structure (121) formed on the substrate surface in the active region (103) as well as p-doped drain/source diffusion regions (16) formed in the N-well (101b). The drain/source regions (16) of the NMOS and PMOS transistors (110) and (120) included shallow extended diffusions regions (16a) and deep highly doped diffusion regions (16b). The source/drain regions (16) of the transistors (110) and (120) include metal silicide contact regions (17).

The gate structures (111) and (121) have similar structures, each comprising a polysilicon (poly-Si) gate electrode (11/12/13) formed of stacked layers including a dielectric layer (11), a polysilicon layer (12) and a metal silicide layer (13). Moreover, the gate structures (111) and (121) each have first sidewall spacer insulating layers (14) and second sidewall spacer insulating layers (15). The first spacer insulating layers (14) are thin L-shaped insulating spacers that are interposed between the second spacer insulation layers (15) and the sidewalls of the gate electrode stacked layers (11/12/13) and a portion of the surface of the active silicon regions adjacent the gate sidewalls. In one embodiment, the first spacer insulating layers (14) are formed of oxide and the second gate insulating spacer layers (15) are formed of nitride.

The CMOS semiconductor device (100) of FIG. 1A can be fabricated using known techniques. The semiconductor substrate (101) may comprise a bulk silicon substrate where the p-type semiconductor layer (101a) may be an upper surface portion thereof or a semiconductor portion epitaxially grown on the bulk substrate or formed using wafer bond techniques. In other embodiments, the semiconductor substrate (101) may be an SOI (silicon on insulator substrate). The isolation region (104) may be formed by conventional processes, for example shallow trench isolation (STI) structures that are back filled with an oxide dielectric, for example TEOS oxide. The N-well region (101b) may be formed by conventional N-well fabrication process which includes forming an ion implantation mask, followed by ion implantation and activation annealing, as is understood in the art.

The gate structures (111) and (121) may be formed by conventional processes. For example, the gate electrode layers (11) and (12) may be formed by sequentially forming an oxide layer and a polysilicon layer, followed by photolithographic patterning and plasma assisted etching e.g., an (RIE) process to form polysilicon gate electrode structures (11)/(12). Following formation of the polysilicon gate electrodes (11/12), source/drain extension regions (16a) can be formed using a conventional ion implant process adjacent the polysilicon electrodes to a shallow depth beneath the silicon substrate surface according to a low energy ion implantation or plasma immersion doping process.

A thin conformal layer of oxide material is be formed over the active surface of the substrate (101) to encapsulate the gate electrode layers (11/12), wherein the layer is patterned after ion implantation to form the first spacer insulating layers (14). The second spacer insulating layers (15) spacers (dielectric offset spacers) may be formed along the polysilicon gate electrode sidewalls by depositing a layer of silicon nitride, for example, followed by an anisotropic etch process to form self-aligned sidewall spacers (15) on either side of the polysilicon gate electrodes.

Following sidewall spacer (15) formation, a conventional a high dose ion implantation (HDI) process can be performed to form the doped source/drain (S/D) regions e.g., (16b). The top portion of the polysilicon electrodes (12) can be doped during at the same time as the HDI process is performed. Thereafter, a silicidation process may be performed to form metal silicide regions (13), (17) using known techniques. For instance, a conventional silicidation process generally includes blanket depositing a conformal layer of an appropriate refractory metal over the surface of the substrate (101), initiating a chemical reaction between the metal layer arid underlying silicon or semiconductor material of the diffusion regions (16) and gate electrode (12) to thereby form a metal silicide layers (13) and (17), and then removing portions of the non-reacted refractory metal by a selective etch. In this process, the sidewall spacers (15) act as reaction masks where substantially no reaction occurs between the refractory metal and the material of the sidewall spacer (15) to thereby avoid formation of a conductive path between the gate silicide layers (13) and the drain and source regions (16) of associated transistors (110) and (120).

At the stage of fabrication in FIG. 1A, the second spacer insulating layers (15) are part of the gate structures (111) and (120) and disposed on the sidewalls on the gate electrode stack 11/12/13. For reasons as discussed above, it is desirable to remove the spacers (15), but without damaging the silicide layers (13) and (17) or other transistor structures. An exemplary spacer removal process according to an embodiment of the invention will now be discussed with reference to FIGS. 1B~1H.

Figure 1B:
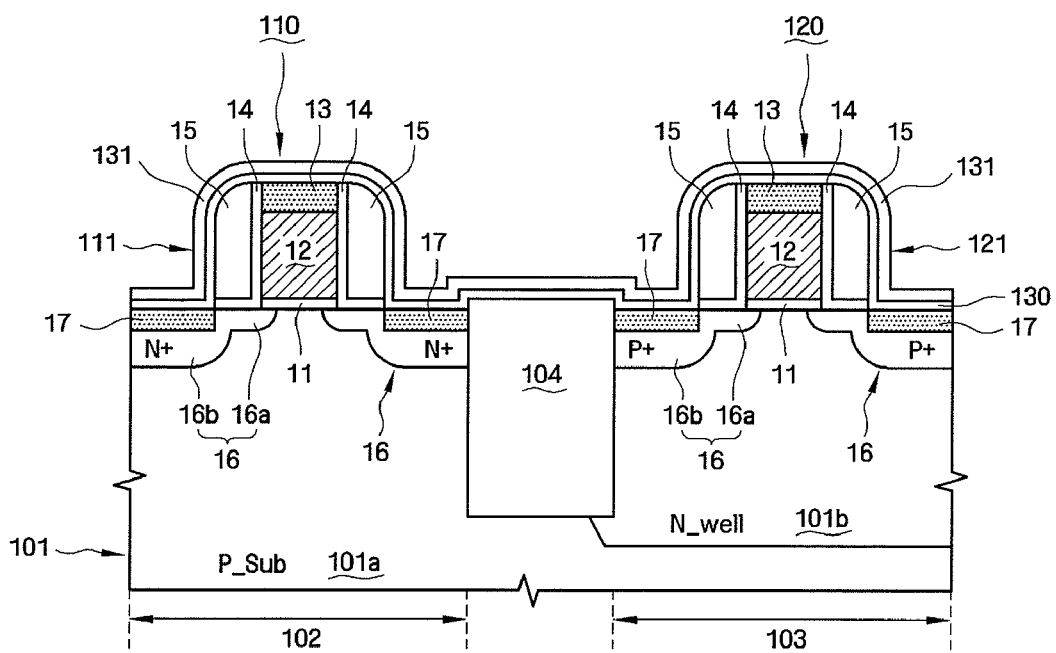

Referring to FIG. 1B, a first conformal insulating layer (130) and second conformal insulating layer (131) are sequentially formed over the active surface of the semiconductor substrate (101). In one exemplary embodiment of the invention, the first conformal insulating layer (130) is formed of an oxide, such as a LTO (low temperature oxide), having a thickness in a range of about 50 angstroms to about 200 angstroms, using known techniques. For instance, a conformal insulating layer (130) of LTO may be formed by depositing a silicon oxide by a chemical vapor deposition process at low temperatures e.g., 400 C, while reacting silane (SiH4) and Oxygen (O2) to make SiO2. The insulating layer (130) formed of LTO has a compression relative to the substrate (101), which is lower than that of a layer of grown oxide (e.g., thermal oxide). Moreover, the second conformal insulating layer (131) may be a nitride layer that is formed having a thickness in a range of about 50 A to about 200 A. For example, the conformal insulating layer (131) may be a silicon nitride layer formed using PECVD (plasma enhanced chemical vapor deposition) using silane and ammonia, nitrogen oxide or nitrogen, as is known in the art.

Figure 1C:
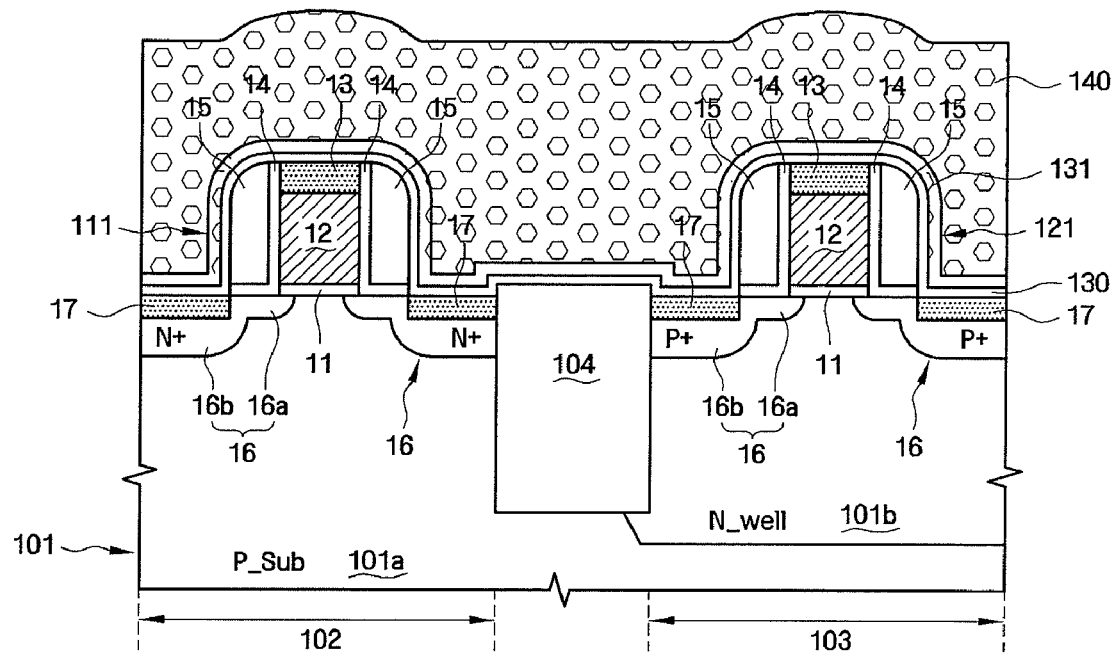

Next, as illustrated in FIG. 1C, a layer of organic material (140) is formed over the active surface of the semiconductor substrate (101). In one exemplary embodiment of the invention the layer of organic material (140) may be a BARC (bottom anti-reflective coating) material or photoresist material. In one exemplary embodiment of the invention the layer of sacrificial material (310) is formed of an organic material such as a BARC (bottom anti-reflective coating) material or a photoresist material or other suitable organic materials having sufficient via filling properties. The layer of organic material (140) may he formed by blanket depositing a planarizing BARC material having sufficient gap filling properties so that the organic material can be deposited without voids being formed in the regions between the gate structures (111) and (121).

By way of specific example, the organic material (140) may be a polymeric organic BARCs that is deposited via spin-on polymeric materials (e.g., spin-on-glass (SOG) material). Polymeric organic BARCs typically have good gap-fill and planarization properties. In other embodiments, the sacrificial material (310) may be formed of an inorganic material such as an inorganic BARC material (as discussed below).

Figure 1D:
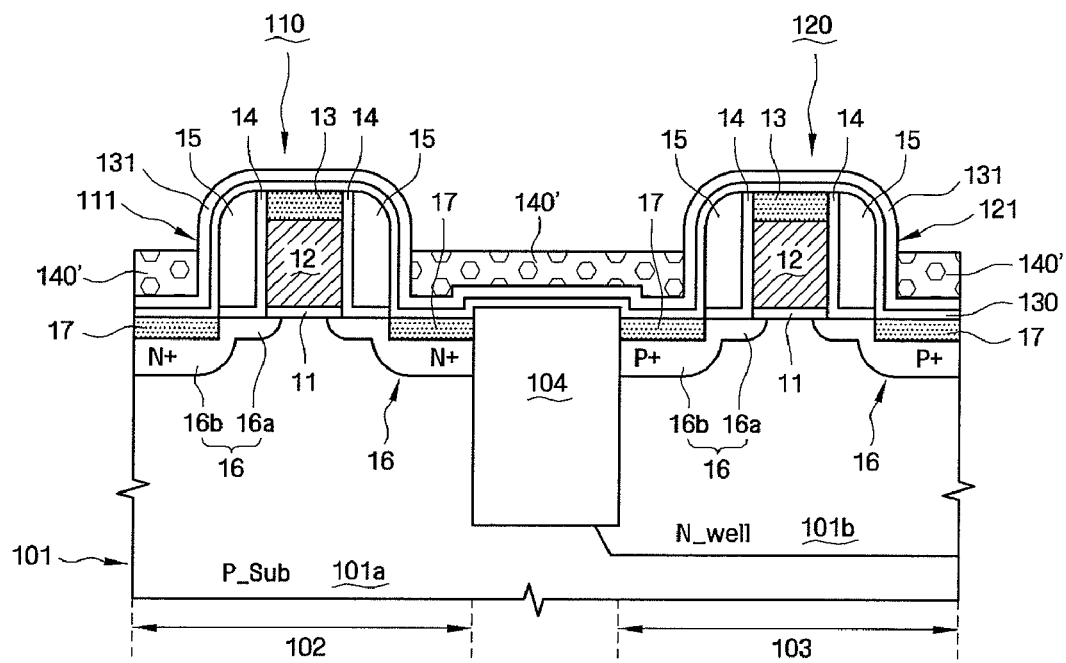

An etch-back process is then performed to etch the layer (140) down to a level below the upper portions of the gate structures (111) and (121). In particular, as illustrated in FIG. 1D, the organic material layer (140) is etched down to about a mid-level of the gate stacks (111) and (121) and thereby form an etch mask (140') of organic material that exposes the portion of the conformal insulating layer (131) on upper sidewall and top surfaces of the gate structures (111) and (121), while covering the remaining portion of the conformal insulating layer (131) formed over the active silicon region. The etch-hack process may foe performed using an anisotropic RIE process with an etch chemistry that is suitable to etch the organic material (140) selective to the material of the conformal insulating layer (131) (e.g., etching organic BARC selective to nitride).

Figure 1E:
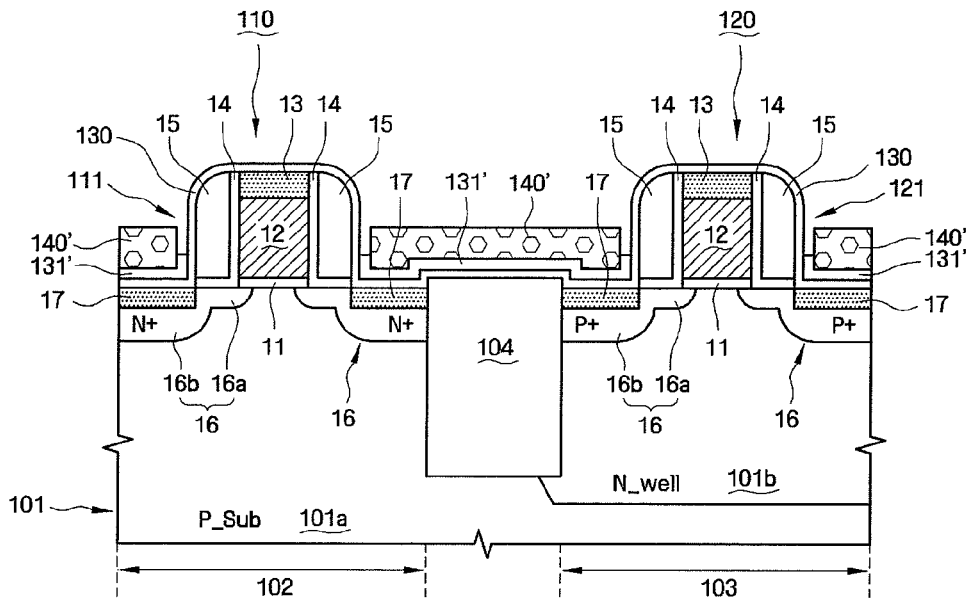

Next, referring to FIG. 1E, an etch process is performed to etch the exposed portions of the second conformal insulating layer (131) down to the first conformal insulating layer (130), while remaining portions of the second insulating layer (131') are protected from being etched by the etch mask (140'). In particular, in an exemplary embodiment where the second conformal insulating layer (131) is formed of a nitride and the first conformal insulating layer (130) is formed of an oxide, the exposed portions of the second conformal insulating layer (131) of nitride can he etched using a RIE process with a suitable etching chemistry selective to oxide to avoid or minimize etching of the first conformal insulating layer (130) of oxide and the etch mask (140') of organic material.

Figure 1F:
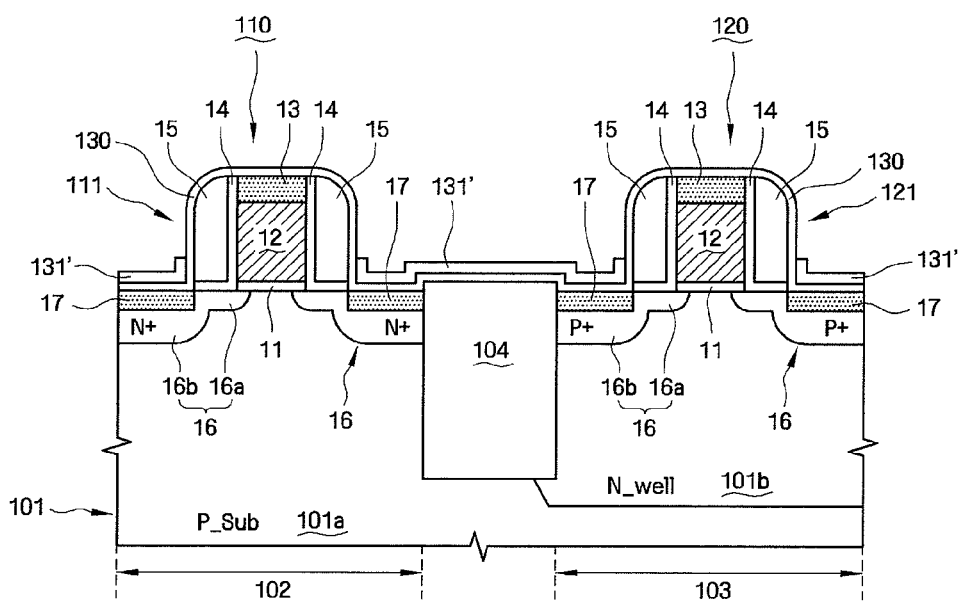

Next, as illustrated in FIG. 1F, an etch process is performed to remove the etch mask (140') of organic material to expose the remaining portions of the second conformal insulating layer (131') formed on the substrate surface. The organic etch mask (140') may be removed using an RIE process with an etching chemistry designed to etch the organic material of the etch mask (140') selective to the material forming the first and second insulating layers (130) and (131) to avoid etching of the exposed portion of the first insulating layer (131) and the remaining portion of the second insulating layer (131').

Figure 1G:
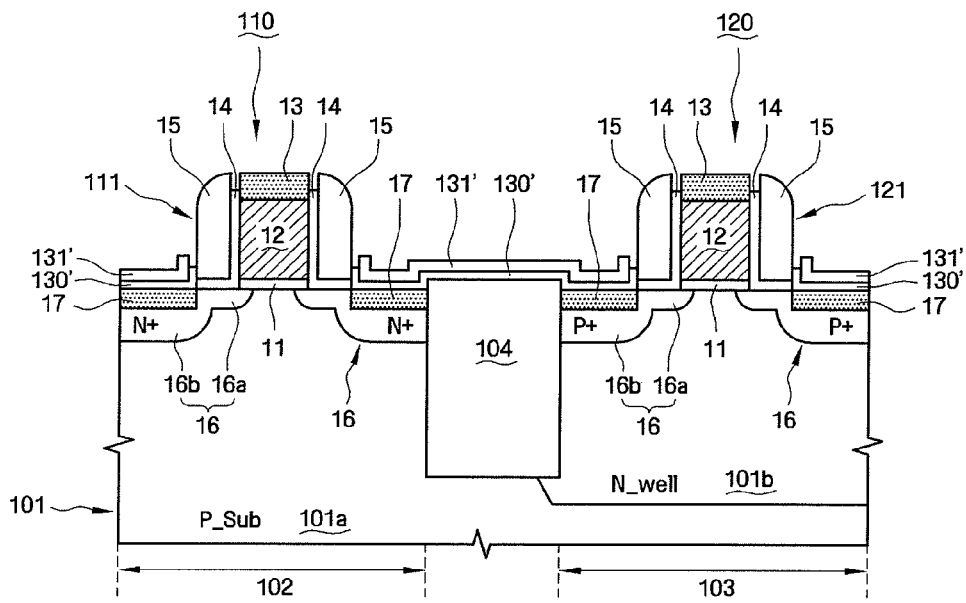

Following removal of the etch mask (140'), an etch process is performed to etch the exposed portions of the first conformal insulating layer (130) using the portions of the second conformal insulating layer (131') as an etch mask to protect underlying portions of the first insulating layer (130') from being etched, thereby resulting in the structure depicted in FIG. 1G. In an exemplary embodiment where the etch mask layer (131') is formed of a nitride and the first conformal insulating layer (130) is formed of an oxide, the exposed portions of the first conformal insulating layer (130) of oxide can be etched using a RIE process with a suitable etching chemistry selective to nitride to avoid or minimize etching of the etch mask (131') of nitride and the spacers (15). In this process, the upper portions of the thin oxide sidewall spacers (14) are slightly etch down, as shown in FIG. 1G.

Figure 1H:
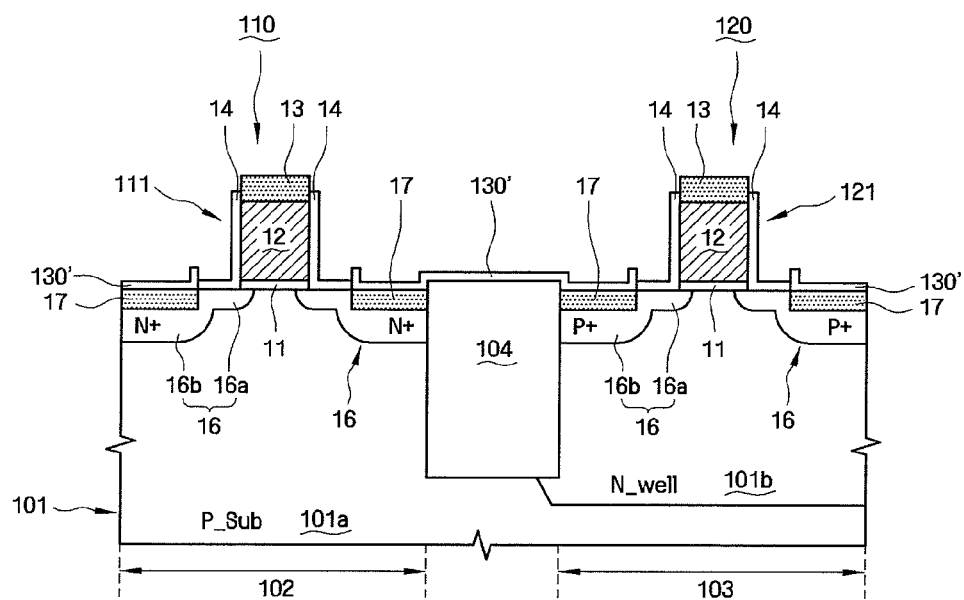
Figure 1I:
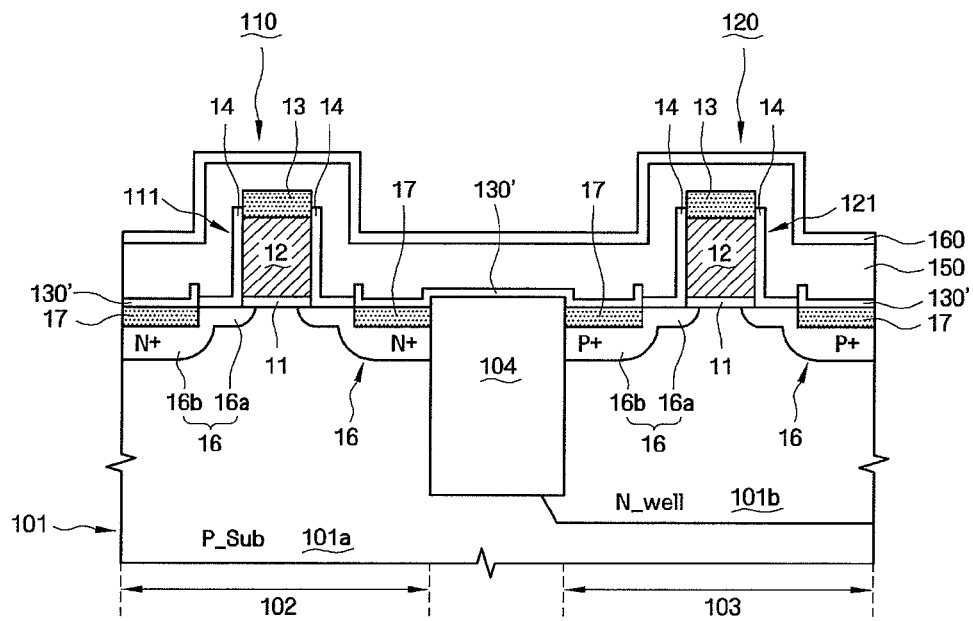
Figure 1J:
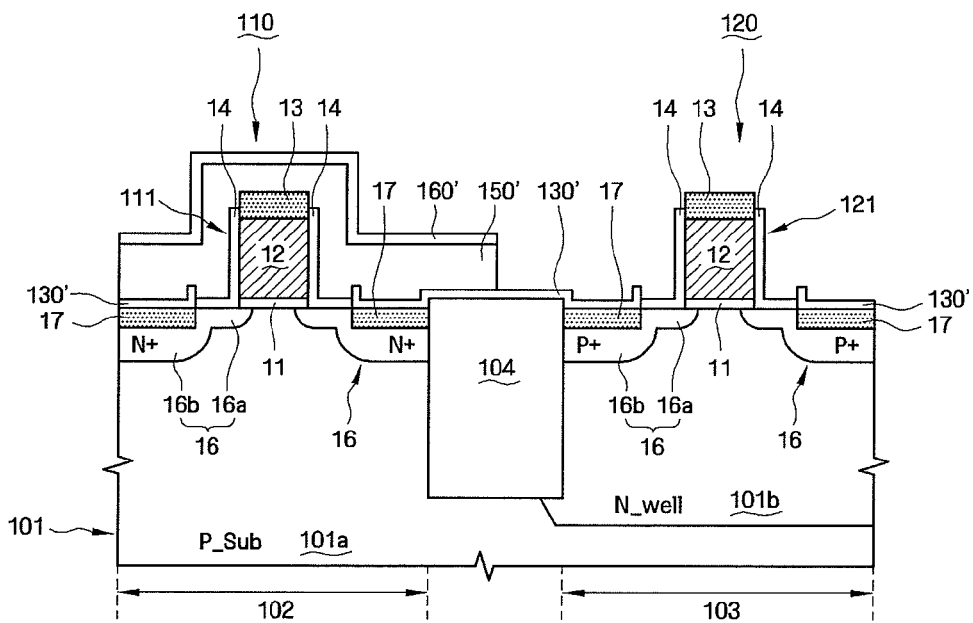

Next, referring to FIG. 1H, a wet etch process is performed to remove the second spacer insulating layers (15) of the gate structures (111) and (121) and the etch mash (131') formed by the remaining portions of second conformal insulating layer (131). In an exemplary embodiment where the spacers (15) and etch mash (131') are formed of nitride, a wet nitride etch process may foe performed to remove the spacers (15) and mask layer (131') selective to the remaining portions of the first conformal insulating layer (130') and first spacer insulating layers (14), which serve at etch stop layers to protect the gate electrode and the surface of the active silicon. In particular, the nitride spacers (15) and nitride mask (131') can foe removed using a hot phosphoric acid-based wet etch solution selective to the oxide materials of spacers (14) and mask layer (130').

It is to be noted that a wet etching suitable for nitride removal may slightly erode the silicide layers (13) of the gate structures (111) and (121). However, the silicide layers (13) are formed with sufficient thickness such that erosion will not affect performance. On the other hand, the silicide contact layers (17) on the source/drain diffusion regions (16) are formed relatively thin (e.g., 250 angstroms), where any erosion could degrade performance. However, during the etch process of FIG. 1H, the insulating oxide layer forming the spacers (14) and the etch mask (130') protect the silicide contact layers (17) from being eroded or otherwise damages from the wet etch process for spacer removal.

FIG. 1H illustrates the semiconductor device (100) at an intermediate stage of FEOL fabrication where the nitride sidewall spacers (15) are effectively removed while avoiding damage or erosion to the drain/source silicide contacts (17). Following spacer removal, fabrication of the CMOS device may continue using any suitable CMOS fabrication process flow suitable for the target application. Depending on the application, the remaining layer of oxide (130') (e.g., LTO) may be used to protect the silicide contacts (17) on the drain/source diffusion regions (16) from oxidation, erosion, etc. for subsequent fabrication processes.

By way of illustration, FIGS. 1I and 1J schematically illustrate initial processing steps of a DSL (dual stress liner) process, which may be implemented as part of the exemplary CMOS fabrication process subsequent to the spacer removal process, wherein the exemplary spacer removal process allows the silicide regions to be protected from damage during formation of nitride stress liners. More specifically, FIG. 1I illustrates initial steps of an exemplary DSL fabrication process which includes sequentially forming a conformal silicon nitride liner layer (150) and a thin conformal oxide layer (160) over the active surface of the substrate (101) covering the NMOS and PMOS transistors (110) and (120). In one embodiment, the conformal silicon nitride liner layer (150) is a tensile nitride layer that is formed to have intrinsic tensile stress to increase the carrier mobility in the channel of the NMOS transistor (110). The tensile silicon nitride liner layer (150) can be formed using well-known methods. Moreover, the thin conformal layer of oxide (160) may be formed over the nitride layer (150) using known techniques. The oxide layer (160) serves as an etch stop layer to protect the nitride layer (150) during subsequent etch processes in the DSL process, as is understood by those of ordinary skill in the art.

The portions of the conformal oxide layer (160) and underlying tensile nitride liner layer (150) are then removed from the active PMOS region (103) by a lithographic patterning process, e.g., forming a photoresist mask to cover the NMOS device region (102) and exposing the PMOS device region (103) and a portion of the STI region (104), followed by an etching process to remove exposed portions of the oxide (160) and nitride (150) layers over the PMOS device region (103), thereby forming etched stress liner layers (150') and (160'), such as depicted in FIG. 1J. The etch process may be performed, for example, through successive RIE etches of the exposed portions of the oxide and nitride layers (160) and (150) over the PMOS device region (103), using the underlying remaining portions of the first insulating layers (130') of oxide as an etch stop. In other words, since the silicide contacts (17) are covered by LTO mask layer (130'), the underlying silicide contacts (17) in the PMOS device region (103) are not exposed to the etching environment or photoresist removal process. This is in contrast to some conventional techniques, the etch process is preformed using the silicide regions (17) as etch stops.

Thereafter a compressive second silicon nitride layer (not shown) is blanket deposited over the active surface of the substrate covering the NMOS and PMOS device regions (102) and (103), using known techniques. The second layer is a formed of material (e.g., nitride) that will apply a compressive stress to the channel of the PMOS transistor (120). Thereafter, the portions of the compressive nitride layer overlying the layers (160') and (150') in the device region (102) are removed etching the compressive nitride layer in the device region (102) using the oxide layer (160') as an etch stop layer, as is understood in the art.

FIGS. 2A~2F schematically illustrate a CMOS semiconductor fabrication process which incorporates a spacer removal process according to another exemplary embodiment of the invention. In particular, FIGS. 2A~2F illustrate a variation to the exemplary spacer removal process flow discussed above with reference to FIGS. 1B~1H. For ease of discussion, initial reference is made to FIG. 2A, which illustrates an intermediate stage of fabrication, where a thin conformal insulating layer (130) of oxide (e.g., LTO) is formed over the active surface of the substrate (101) of the semiconductor CMOS device (100) of FIG. 1A. At this stage, the exemplary method differs from, that discussed above with reference to FIG. 1B, in that a second conformal insulating layer is not deposited over the first layer (130).

Figure 2A:
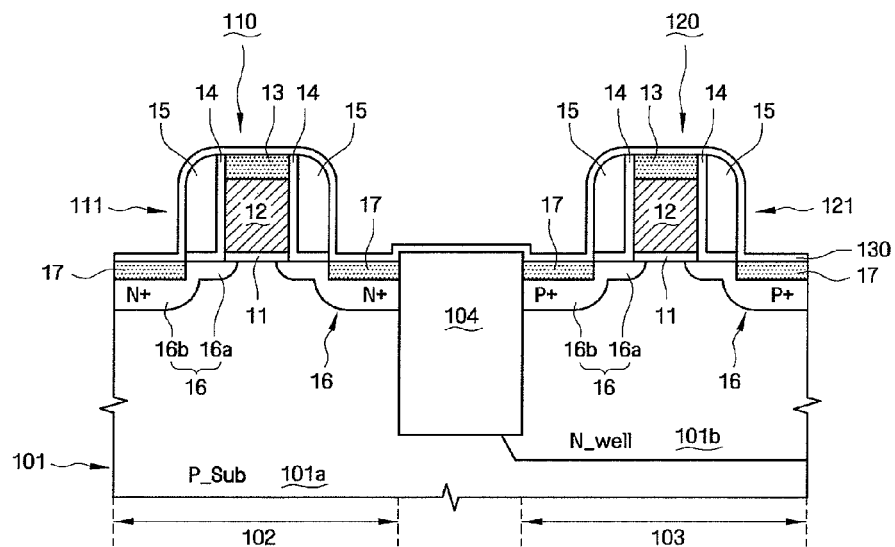
FIGS. 2A~2F schematically illustrate a CMOS semiconductor fabrication process which incorporates a spacer removal process according to another exemplary embodiment of the invention.
Figure 2B:
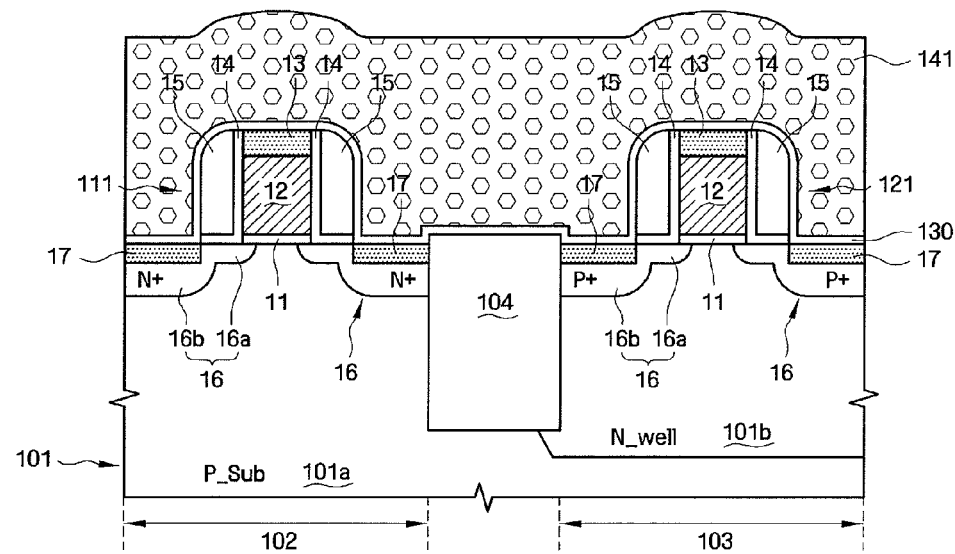

Instead, as depicted in FIG. 2B, a layer of material (141) is formed over the active surface of the semiconductor substrate (101) to cover the conformal insulating layer (130). In one exemplary embodiment where the insulating layer (130) is formed of an oxide such as LTO, the layer of material (141) may be a BARC (bottom anti-reflective coating) material or photoresist material that can be etched in a non-reduction etch environment (with no or little oxygen) so that the material (141) can be etched highly selective to the oxide insulating layer (130) (as discussed below). The layer of material (141) may foe formed by depositing an inorganic BARC material using chemical vapor deposition (CVD), for example.

Figure 2C:
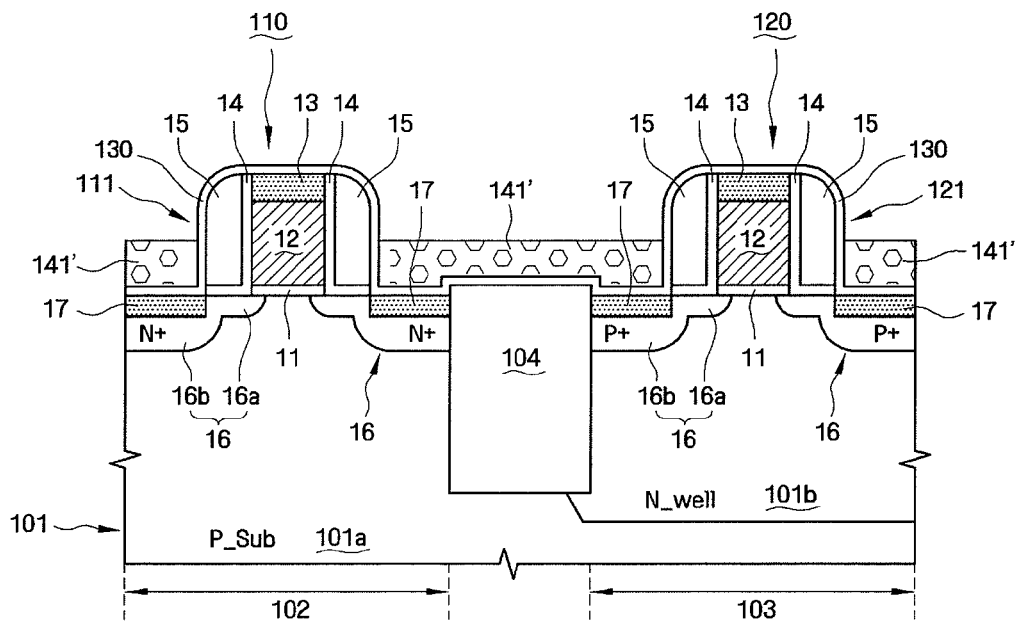

An etch-back process is then performed to etch the layer (141) down to a level below the upper portions of the gate structures (111) and (121). In particular, as illustrated in FIG. 2C, the material layer (141) is etched down to about a mid-level of the gate stacks (111) and (121) and thereby form an etch mask (141') of that exposes the portion of the conformal insulating layer (130). The etch-back process may be performed using RIE in a non-reduction ambient to etch the material of layer (141) highly selective to layer of oxide material (130).

Figure 2D:
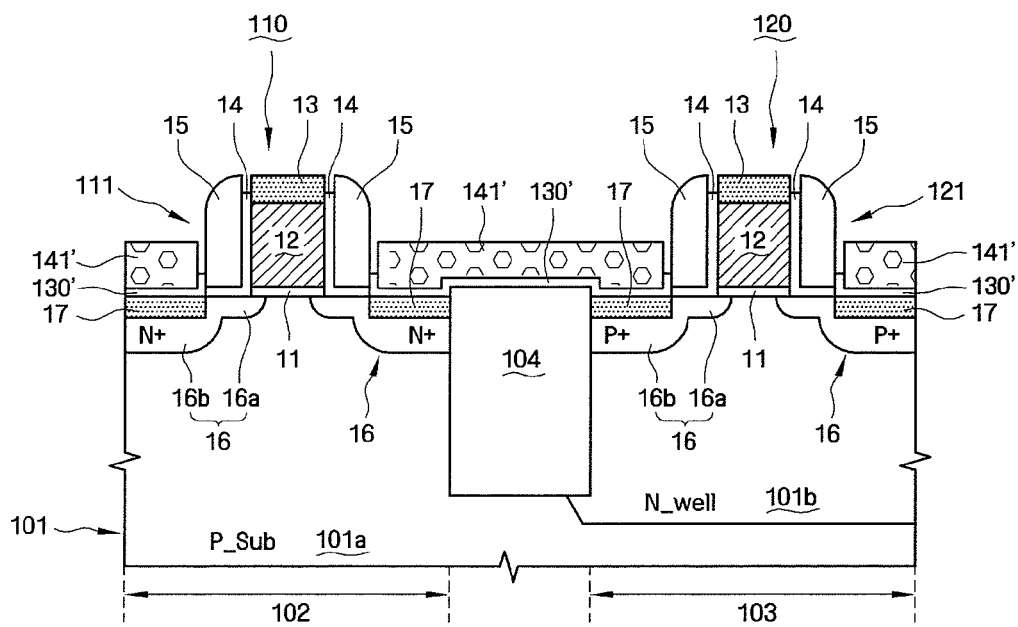

Next, referring to FIG. 2D, an etch process is performed to etch the exposed portions of the conformal insulating layer (130) using the etch mask (141') to protect underlying portions of the insulating layer (130') from being etched. In particular, in an exemplary embodiment where the conformal insulating layer (130) is formed of an oxide, the exposed portions of conformal insulating layer (130) can be etched using a RIE process with a suitable etching chemistry selective to the material of the etch mask (141') and the material of spacers (15). In this process, the sidewall spacers (14) are slightly etched and recessed, as depicted in FIG. 2D.

Figure 2E:
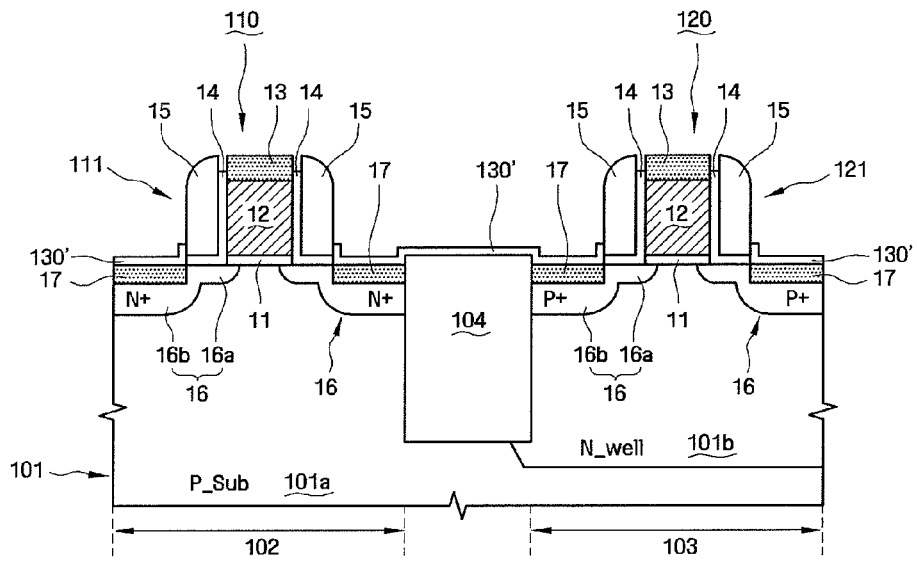

Next, as illustrated in FIG. 2E, an etch process is performed to remove the etch mask (141') of inorganic material to expose the remaining portions of the conformal insulating layer (130') formed on the substrate surface. The inorganic etch mask (141') may be removed using an RIE process with an etching chemistry designed to etch the material of the etch mask (141') selective to the insulating material (e.g., LTO) of the mask layer (130') and the spacers (14).

Figure 2F:
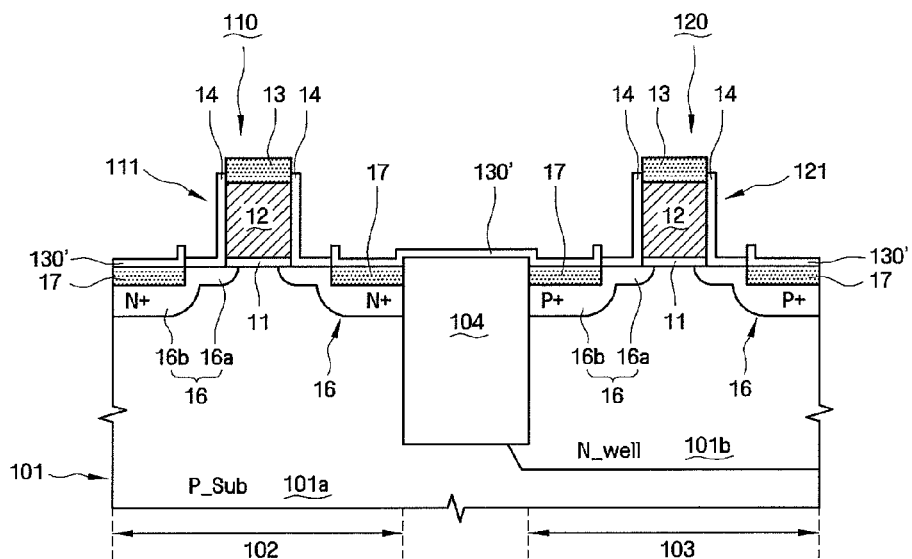

Following removal of the etch mask (141'), an etch process is performed to remove the second spacer insulating layers (15) of the gate structures (111) and (121), resulting in the exemplary structure depicted in FIG. 2F. In an exemplary embodiment where the spacers (15) are formed of nitride, a wet nitride etch process may be performed to remove the spacers (15) selective to the oxide materials of the insulating layer (130') and first spacer insulating layers (14), which serve at etch stop layers to protect the gate electrode and the surface of the active silicon. In particular, the nitride spacers (15) can be removed using a hot phosphoric acid-based wet etch solution selective to the oxide materials of spacers (14) and mask layer (130').

FIG. 2F illustrates the semiconductor device (100) at an intermediate stage of FEOL fabrication (similar to that depicted in FIG. 1H) where the nitride sidewall spacers (15) are effectively removed while avoiding damage or erosion to the drain/source silicide contacts (17). Following spacer removal, fabrication of the CMOS device may continue using any suitable CMOS fabrication process flow suitable for the target application (such as described with reference to FIGS. 1I and 1J), where depending on the application, the remaining layer of oxide (130') (e.g., LIO) may be used to protect the silicide contacts (17) on the drain/source diffusion regions (16) front oxidation, erosion, etc., for subsequent fabrication processes.

Although exemplary embodiments have been described herein with reference to the accompanying drawings, it is to foe understood that the invention is not limited to the exemplary embodiments described herein, and that various other changes and modifications may be readily envisioned by one of ordinary skill in the art without departing form the scope or spirit of the invention. All such changes and modifications are intended to be included within the scope of the invention as defined by the appended claims.

We claim:

1. A method for fabricating a semiconductor device, comprising:

forming a transistor device in an active silicon region of a semiconductor substrate, wherein the transistor device comprises a gate structure having a gate electrode and first and second sidewall spacers formed on respective first and second sidewalls of the gate electrode, and first and second diffusion regions formed in the active silicon region adjacent the first and second sidewall spacers, respectively, wherein the first and second sidewall spacers each comprise a first spacer insulating layer and a second spacer insulating layer, wherein the first spacer insulating layer is interposed between the second spacer insulating layer and the gate electrode sidewall and a surface of the active silicon region adjacent the first and second sidewalls of the gate electrode;

forming a conformal insulating layer over the gate structure and the active silicon region;

depositing a layer of organic material over the conformal insulating layer and performing a first etch process to etch back the layer of organic material; to form an etch mask of the same organic material to cover a portion of the conformal insulating layer over the active silicon region while exposing a portion of the conformal insulating layer formed on upper sidewall and top surfaces of the gate structure etching the exposed portion of the conformal insulating layer using the etch mask of organic material; and removing the second spacer insulating layers of the first and second sidewall spacers using an etch process in which an etch selectivity of material forming the second spacer insulating layer is greater than that an etch selectivity of the materials forming the first spacer insulating layers and the conformal insulating layer so as to protect the sidewall surfaces of the gate electrode and the surface of the active silicon region from etch damage when etching the second spacer insulating layers.

2. The method of claim 1, wherein etching the exposed portion of the conformal insulating layer using the etch mask of organic material comprises removing the conformal insulating layer to expose the second spacer insulating layers using an etch process in which an etch selectivity of material forming the conformal insulating layer is greater than an etch selectivity of material forming the second spacer insulating layers.

3. The method of claim 2, further comprising removing the etch mask of organic material before removing the second spacer insulating layers.

4. The method of claim 3, wherein the etch mask of organic material is removed using an ashing process in a reduction ambient.

5. The method of claim 3, wherein the first spacer insulating layers are formed of an oxide material, wherein the second spacer insulating layers are formed of a nitride material, and wherein the conformal insulating layer is formed of an oxide material.

6. The method of claim 5, wherein the second spacer insulating layers are removed using a wet etching process using an etching solution selective to the nitride material.

7. The method of claim 6, wherein the etching solution is a phosphoric acid solution.

8. The method of claim 1, wherein forming a conformal insulating layer comprises forming a first conformal insulating layer and forming a second conformal insulating layer over the first conformal insulating layer.

9. The method of claim 8, wherein etching the exposed portion of the conformal insulating layer using the etch mask of organic material comprises removing the exposed portion of the second conformal insulating layer down to first conformal insulating layer.

10. The method of claim 9, further comprising removing the etch mask of organic material to expose a remaining portion of the second conformal insulating layer formed over the active silicon region, wherein removing the second spacer insulating layers of the first and second sidewall spacers comprises etching exposed portions of the first conformal insulating layer using the reaming portion of the second conformal nitride layer as an etch mask and etching the second spacer insulating layers and remaining portion of the second conformal insulating layer using a remaining portion of the first conformal insulating layer and first spacer insulating layers as etch protective layers to protect the gate electrode and the surface of the active silicon when removing the second spacer insulating layers.

11. The method of claim 10, wherein the etch mask of organic material is removed using an ashing process.

12. The method of claim 10, wherein the first spacer insulating layers are formed of an oxide material, wherein the second spacer insulating layers are formed of a nitride material, wherein the first conformal insulating layer is formed of an oxide material and wherein the second conformal insulating layer is formed of a nitride material.

13. The method of claim 12, wherein the second spacer insulating layers are removed using a wet etching process using an etching solution selective to the nitride material.

14. The method of claim 13, wherein the etching solution is a phosphoric acid solution.

15. A method for fabricating a semiconductor device, comprising:

forming a transistor device in an active silicon region of a semiconductor substrate, wherein the transistor device comprises a gate structure having a gate electrode and first and second sidewall spacers formed on respective first and second sidewalls of the gate electrode, and first and second silicide layers and diffusion regions formed in the active silicon region adjacent the first and second sidewall spacers, respectively, wherein the first and second sidewall spacers each comprise a first spacer insulating layer and a second spacer insulating layer, wherein the first spacer insulating layer is interposed between the second spacer insulating layer and the gate electrode sidewall and a surface of the active silicon region adjacent the first and second sidewalls of the gate electrode;

forming a conformal insulating layer to cover the gate structure and the first and second silicide layers in the active silicon region adjacent the first and second sidewall spacers;

depositing a layer of organic material over the conformal insulating layer and performing a first etch process to etch back the layer of organic material to expose a portion of the conformal insulating layer formed on upper sidewall and top surfaces of the gate structure and form an etch mask of the same organic material to protect a portion of the conformal layer formed over the first and second silicide layers in the active silicon region;

performing a second etch process to remove the exposed portion of the conformal insulating layer using the etch mask of organic material;

removing the etch mask of organic material to expose the portion of the conformal layer formed over the first and second silicide layers and active silicon region;

performing a third etch process to remove the second spacer insulating layers of the first and second sidewall spacers using an etch process in which an etch selectivity of a material forming the second insulating layers is greater than an etch selectivity of materials forming the first spacer insulating layers and the conformal insulating layer such that first spacer insulating layer and conformal insulating layer protect the sidewall surfaces of the gate electrode and the first and second silicide layers from etch damage during the third etch process.

16. The method of claim 15, wherein forming the conformal insulating layer comprises forming a low temperature oxide (LTO) layer.

17. The method of claim 16, wherein the LTO layer is formed having a thickness in a range of about 50 angstroms to about 200 angstroms.

18. The method of claim 15, wherein the layer of organic material comprises a BARC material.

19. The method of claim 15, wherein the layer of organic material comprises a photoresist material.

20. The method of claim 15, wherein removing the etch mask of organic material is performed using an ashing process in a reduction ambient.

21. The method of claim 15, wherein the second etch process to remove the exposed portion of the conformal insulating layer is performed using an etch process in which an etch selectivity of material forming the conformal insulating layer is greater than an etch selectivity of material forming the second spacer insulating layers.

22. The method of claim 21, wherein the third etch process is performed using a wet etch process.

23. The method of claim 22, wherein the first spacer insulating layer is formed of an oxide, wherein the second spacer insulating layer is formed of a nitride, and wherein the conformal insulating layer is formed of an oxide.

24. The method of claim 22, wherein the wet etch process is performed using phosphoric acid solution to remove the nitride material selective to the oxide materials.

25. A method for fabricating a semiconductor device, comprising:

forming a transistor device in an active silicon region of a semiconductor substrate, wherein the transistor device comprises a gate structure having a gate electrode and first and second sidewall spacers formed on respective first and second sidewalls of the gate electrode, and first and second silicide layers and diffusion regions formed in the active silicon region adjacent the first and second sidewall spacers, respectively, wherein the first and second sidewall spacers each comprise a first spacer insulating layer and a second spacer insulating layer, wherein the first spacer insulating layer is interposed between the second spacer insulating layer and the gate electrode sidewall and a surface of the active silicon region adjacent the first and second sidewalls of the gate electrode;

forming a first conformal insulating layer to cover the gate structure and the first and second silicide layers in the active silicon region adjacent the first and second sidewall spacers;

forming a second conformal insulating layer over the first conformal insulating layer;

depositing a layer of organic material over the second conformal insulating layer and performing a first etch process to etch back the layer of organic material to expose a portion of the second conformal insulating layer formed on upper sidewall and top surfaces of the gate structure and form an etch mask of the same organic material to cover a portion of the second and first conformal layers formed over the first and second silicide layers in the active silicon region;

performing a second etch process to remove the exposed portion of the second conformal insulating layer down to the first conformal insulating layer using the etch mask of organic material;

removing the etch mask of organic material to expose the portion of the second conformal layer formed over the first and second silicide layers and active silicon region;

performing a third etch process to remove exposed portions of the first conformal insulating layer down to the second spacer insulating layers using an etch process in which an etch selectivity of a material forming the first conformal insulating layer is greater than an etch selectivity of materials forming the second spacer insulating layers and the second conformal insulating layer such that second conformal insulating layer protects the first and second silicide and the active silicon region from etch damage during the third etch process;

performing a fourth etch process to remove the second spacer insulating layers using an etch process in which an etch selectivity of the material forming the second spacer insulating layers is greater than an etch selectivity of materials forming the first spacer insulating layers and the first conformal insulating layer such that first spacer insulating layers and the first conformal insulating layer protects sidewalls of the gate electrode, the first and second silicide layers and the active silicon region from etch damage during the fourth etch process.

26. The method of claim 25, wherein forming the first conformal insulating layer comprises forming an LTO (low temperature oxide) layer.

27. The method of claim 26, wherein the LTO layer is formed having a thickness in a range of about 50 angstroms to about 200 angstroms.

28. The method of claim 25, wherein forming the second conformal insulating layer comprises depositing a layer of nitride material.

29. The method of claim 28, wherein the layer of nitride material is formed having a thickness in a range of about 50 angstroms to about 200 angstroms.

30. The method of claim 25, wherein the layer of organic material comprises a BARC material.

31. The method of claim 25, wherein the layer of organic material comprises a photoresist material.

32. The method of claim 25, wherein the first etch process is performed using RIE (reactive ion etching) and wherein the etch mask of organic material is removed using an ashing process.

33. The method of claim 25, wherein the first spacer insulating layer is formed of an oxide, wherein the second spacer insulating layer is formed of a nitride, wherein the first conformal insulating layer is formed of an oxide, and wherein the second conformal insulating layer is formed of a nitride.

34. The method of claim 33, wherein the third etch process is performed using a dry etch process.

35. The method of claim 33, wherein the fourth etch process is performed using a wet etch process that removes the nitride material of the second conformal insulating layer and the second spacer insulating layers selective to the oxide material forming the first spacer insulating layers and the portion of the first conformal insulating layer formed over the first and second silicide layers and active silicon region.

36. The method of claim 35, wherein the wet etch process is performed using phosphoric acid solution.

* * * * *